United States Patent
Kishikawa et al.

(10) Patent No.: US 9,164,370 B2
(45) Date of Patent: Oct. 20, 2015

(54) EXPOSURE APPARATUS AND DEVICE MANUFACTURING METHOD USING ORIGINAL WITH PHASE-MODULATION DIFFRACTION GRATING TO FORM INTERFERENCE PATTERN

(75) Inventors: Yasuhiro Kishikawa, Utsunomiya (JP); Tokuyuki Honda, Tokyo (JP); Seiji Takeuchi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 1298 days.

(21) Appl. No.: 12/418,420

(22) Filed: Apr. 3, 2009

(65) Prior Publication Data
US 2009/0257039 A1    Oct. 15, 2009

(30) Foreign Application Priority Data
Apr. 10, 2008  (JP) ................. 2008-102560

(51) Int. Cl.
*G03B 27/72*  (2006.01)
*G03B 27/32*  (2006.01)
*G03F 7/20*   (2006.01)

(52) U.S. Cl.
CPC ............... *G03B 27/72* (2013.01); *G03B 27/32* (2013.01); *G03F 7/70583* (2013.01)

(58) Field of Classification Search
CPC  G03F 7/70583; G03F 7/70408; G03F 7/7035
USPC ................................ 355/71, 70, 53
See application file for complete search history.

(56) References Cited

U.S. PATENT DOCUMENTS

| | | | |
|---|---|---|---|
| 5,745,221 A | 4/1998 | Nishiwaki | |
| 6,310,996 B1 * | 10/2001 | Byron | ............... 430/321 |
| 6,694,075 B1 * | 2/2004 | Bhatia et al. | ............ 385/37 |
| 6,730,920 B2 * | 5/2004 | Groeneveld et al. | ..... 250/491.1 |

FOREIGN PATENT DOCUMENTS

| | | |
|---|---|---|
| JP | 10-161295 A | 6/1998 |
| JP | 2006-344674 A | 12/2006 |
| JP | 2007-027350 A | 2/2007 |

* cited by examiner

*Primary Examiner* — Chia-How Michael Liu
(74) *Attorney, Agent, or Firm* — Canon U.S.A., Inc. IP Division

(57) ABSTRACT

An exposure apparatus which exposes a substrate coated with a photoresist to form a latent image to the photoresist, comprises an original holding unit configured to hold an original including a phase-modulation diffraction grating so that an interference pattern is formed on a surface of the substrate by a light beam diffracted by the original, a substrate holding unit configured to hold the substrate, and a light beam dividing optical system configured to divide a light beam to form a plurality of light beams which enter the original, wherein a latent image is formed on the substrate by superposition of a plurality of interference patterns formed on the surface of the substrate, the plurality of interference patterns respectively corresponding to the plurality of light beams which enter the original.

14 Claims, 5 Drawing Sheets

EXPOSURE APPARATUS AND DEVICE MANUFACTURING METHOD USING ORIGINAL WITH PHASE-MODULATION DIFFRACTION GRATING TO FORM INTERFERENCE PATTERN

BACKGROUND OF THE INVENTION

1. Field of the Invention

The present invention relates to an exposure apparatus which exposes a substrate, and a device manufacturing method using the same.

2. Description of the Related Art

A projection exposure method used in manufacturing, for example, semiconductor devices has been known. In this method, a pattern formed on an original (reticle) is projected onto a substrate coated with a photoresist by a projection optical system to expose the substrate.

Japanese Patent Laid-Open No. 10-161295 proposes an interference exposure method using a diffraction grating (phase-shift grating) as one exposure method of forming a fine pattern with a simple arrangement. The interference exposure using a diffraction grating is an exposure method of forming an interference pattern on a substrate by a plurality of diffracted light beams generated by irradiating a diffraction grating with a light beam having coherency, thereby exposing the substrate using this interference pattern. This exposure method uses an arrangement simpler than that used in the projection exposure method, and therefore has the feature that it can easily form a periodic interference pattern with a high resolution and a large depth of focus at a low apparatus cost.

As another interference exposure method using a diffraction grating, Japanese Patent Laid-Open No. 2007-027350 proposes a method of scanning and exposing a large-area exposure region by scanning a substrate with respect to a diffraction grating. In this method, two diffraction gratings having different grating pitches are used so that light beams diffracted at nearly the same point on the first grating are diffracted by the second grating and superposed on each other again at nearly the same point on the substrate. Hence, a high-contrast interference pattern can be obtained even when the gratings are irradiated with low-coherency illumination light.

When high-coherency light is used as the exposure light, an unwanted interference pattern called a speckle is generated. The term speckle refers to a speckled intensity distribution generated as high-coherency light (coherent light) is scattered by the minute three-dimensional pattern on the object plane, and the scattered light beams interfere with each other on the substrate in a random phase relationship. The contrast of a finally obtained pattern may decrease as speckle-induced noise components are superposed on a targeted interference pattern, resulting in local defects of the final pattern.

SUMMARY OF THE INVENTION

The present invention provides an exposure apparatus which has a simple arrangement and is suitable for reducing the influence of speckles.

One of the aspects of the present invention provides an exposure apparatus which exposes a substrate coated with a photoresist to form a latent image to the photoresist, the apparatus comprising an original holding unit configured to hold an original including a phase-modulation diffraction grating so that an interference pattern is formed on a surface of the substrate by a light beam diffracted by the original, a substrate holding unit configured to hold the substrate, and a light beam dividing optical system configured to divide a light beam to form a plurality of light beams which enter the original, wherein a latent image is formed on the substrate by superposition of a plurality of interference patterns formed on the surface of the substrate, the plurality of interference patterns respectively corresponding to the plurality of light beams which enter the original.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings.

First Embodiment

Figure 1:
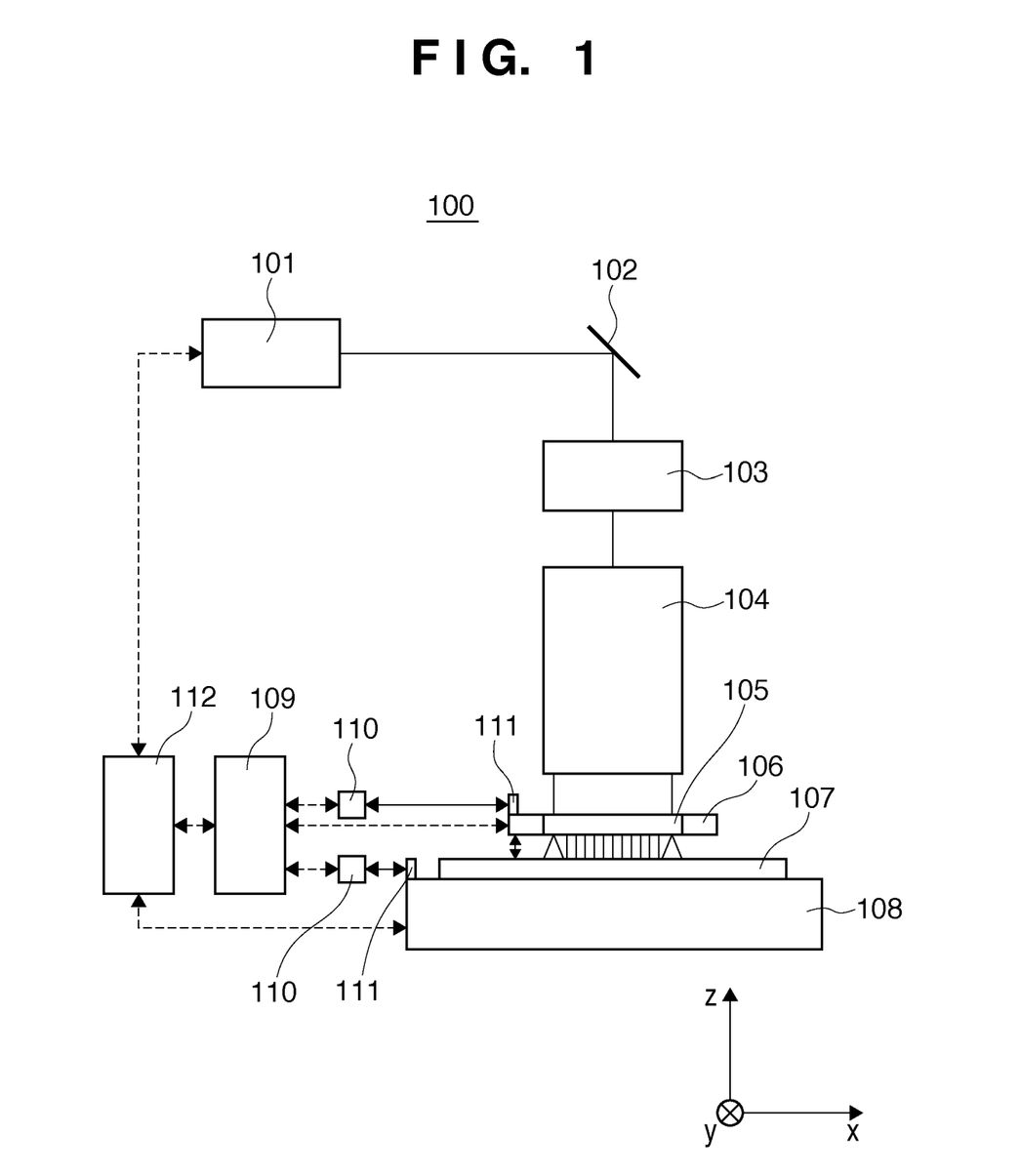
FIG. 1 is a view showing the schematic arrangement of an exposure apparatus according to a preferred embodiment of the present invention.

FIG. 1 is a view schematically showing the arrangement of an exposure apparatus 100 according to the first embodiment of the present invention. Throughout this specification and the accompanying drawings, the directions are represented by an x-y-z coordinate system in which the scanning direction of an exposure target substrate is the y direction, the direction of the normal to the surface of the substrate is the z direction, and a direction perpendicular to the y and z directions is the x direction.

The exposure apparatus 100 includes a light source 101, reflecting mirror 102, light beam dividing optical system 103, beam shaping optical system 104, original holding unit 106, substrate stage (substrate holding unit) 108, measurement unit 109, and control unit 112.

The light source 101 can include, for example, a mercury lamp, semiconductor laser, solid-state laser, gas laser, or excimer laser. Although a light beam emitted by the light source 101 enters the light beam dividing optical system 103 via the reflecting mirror 102 in the arrangement example shown in FIG. 1, it may directly enter the light beam dividing optical system 103.

The light beam dividing optical system 103 splits the incident light beam to form a plurality of light beams which enter an original 105 held by the original holding unit 106. The plurality of light beams are parallel to the y-z plane. The plurality of light beams may be those that are parallel to the y-z plane and are not parallel to each other, or those that are parallel to the y-z plane and are parallel to each other.

Although the light beam dividing optical system 103 is inserted in the optical path between the reflecting mirror 102 and the beam shaping optical system 104 in the arrangement example shown in FIG. 1, it may be set anywhere in the optical path between the light source 101 and the beam shaping optical system 104. Alternatively, the light beam dividing optical system 103 may be included in the beam shaping optical system 104.

The beam shaping optical system 104 shapes the section of the incident light beam. The beam shaping optical system 104 shapes that section into, for example, a strip shape having its longitudinal direction parallel to the x direction. The beam shaping optical system 104 can include, for example, a beam expander including a plurality of cylindrical lenses. Optical elements which constitute the beam shaping optical system 104 are not limited to cylindrical lenses, and a targeted sectional shape can be obtained even by using, for example, prisms and lenses. To uniform the in-plane intensity distribution of the light beam shaped into a strip shape, the beam shaping optical system 104 may include a light-shielding member such as an aperture and a correction member such as a neutral density filter. Alternatively, a spatial filter using a pinhole may be inserted in the optical path.

The original 105 includes a phase-modulation diffraction grating, and interference patterns are formed on the image forming plane by light beams diffracted by the original 105. A substrate 107 is held by the substrate stage 108 so that the surface of the substrate 107 is aligned with the image forming plane. The substrate 107 is coated with a photoresist, which is exposed by interference patterns formed on the surface of the substrate 107 (on the image forming plane) to form a latent image to the photoresist. The latent image is developed in a development process to form a physical pattern.

The exposure apparatus 100 has an arrangement in which optical elements such as lenses and mirrors are not inserted between the original 105 and the substrate 107. From this viewpoint, the exposure apparatus 100 has a basic configuration different from that of an exposure apparatus which projects the pattern of an original onto a substrate by a projection optical system.

The plurality of light beams emerging from the light beam dividing optical system 103 enter the original 105 after being shaped by the beam shaping optical system 104. A plurality of interference patterns are formed on the surface of the substrate 107 in one-to-one correspondence with the plurality of light beams which enter the original 105. A latent image is formed on the substrate 107 by superposition of the plurality of interference patterns. In one embodiment, the light beam dividing optical system 103 causes the plurality of light beams to enter the original 105 so that the plurality of interference patterns partially overlap each other on the image forming plane. In another embodiment, the light beam dividing optical system 103 causes the plurality of light beams to enter the original 105 so that latent images formed on the substrate 107 by the plurality of interference patterns overlap each other (at a certain time interval) by scanning the substrate 107.

The exposure apparatus 100 is typically configured as a scanning exposure apparatus which exposes the substrate 107 while scanning it with respect to the original 105 along the scanning direction. An exposure apparatus 100 of this type has a basic configuration different from that of a scanning exposure apparatus which scans an original and a substrate at a predetermined speed ratio with respect to a projection optical system.

The substrate 107 can be scanned by scanning, by a substrate driving mechanism, the substrate stage 108 which holds the substrate 107. The substrate driving mechanism includes a mechanism which drives the substrate stage 108 so as to control the position and orientation of the substrate 107 in the in-plane directions on the surface of the substrate 107 (the x and y directions), the direction of the normal to the surface (the z direction), and the rotation directions about the respective axes (the θx, θy, and θz directions).

The original holding unit 106 can be driven by an original driving mechanism so as to control the position and orientation of the original 105 in the in-plane directions on the surface of the original 105 (the x and y directions), the direction of the normal to the surface (the z direction), and the rotation directions about the respective axes (the θx, θy, and θz directions). The original 105 preferably stands still during the exposure of the substrate 107. However, the original 105 may be driven in the y direction during the exposure of the substrate 107, and this makes it possible to average the influence of manufacturing errors of the original 105.

The measurement unit 109 measures the position information of the original holding unit 106 and that of the substrate stage 108 in real time using a reference mirror 111 and a laser interferometer 110. In addition, the measurement unit 109 measures the interval (in the z direction) between the original 105 and the substrate 107 using a laser interferometer (not shown). The measurement results obtained by the measurement unit 109 are sent to the control unit 112, and the original holding unit 106 and the substrate stage 108 are positioned at target positions under the control of the control unit 112.

Figure 2:
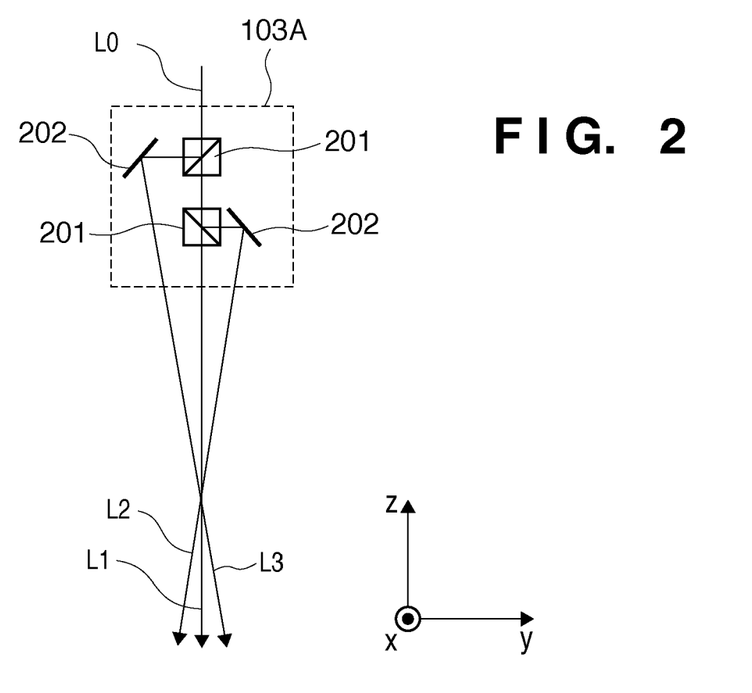
FIG. 2 is a view showing the schematic arrangement of a light beam dividing optical system according to a preferred embodiment of the present invention.

A method of exposing the substrate 107 by the exposure apparatus 100 will be explained next with reference to FIGS. 1 to 5. FIG. 2 is a view showing one arrangement example of the light beam dividing optical system 103. A light beam dividing optical system 103A as one example of the light beam dividing optical system 103 includes two beam splitters 201 and two reflecting mirrors 202. A light beam L0 which enters the light beam dividing optical system 103A is split into light beams L1, L2, and L3 by the beam splitters 201 and the reflecting mirrors 202. Note that the beam splitters 201 and the reflecting mirrors 202 are arranged such that the directions of the light beams L1, L2, and L3 are parallel to the y-z plane and are not parallel to each other. In another embodiment, however, the beam splitters 201 and the reflecting mirrors 202 may be arranged such that the directions of the light beams L1, L2, and L3 are parallel to the y-z plane and are parallel to each other.

The light beam dividing optical system 103 need only split the incident light beam into at least two light beams parallel to the y-z plane, so its arrangement is not limited to that shown in FIG. 2. The light beam dividing optical system 103 may include, for example, a diffraction grating and lens as its constituent elements.

Figure 3:
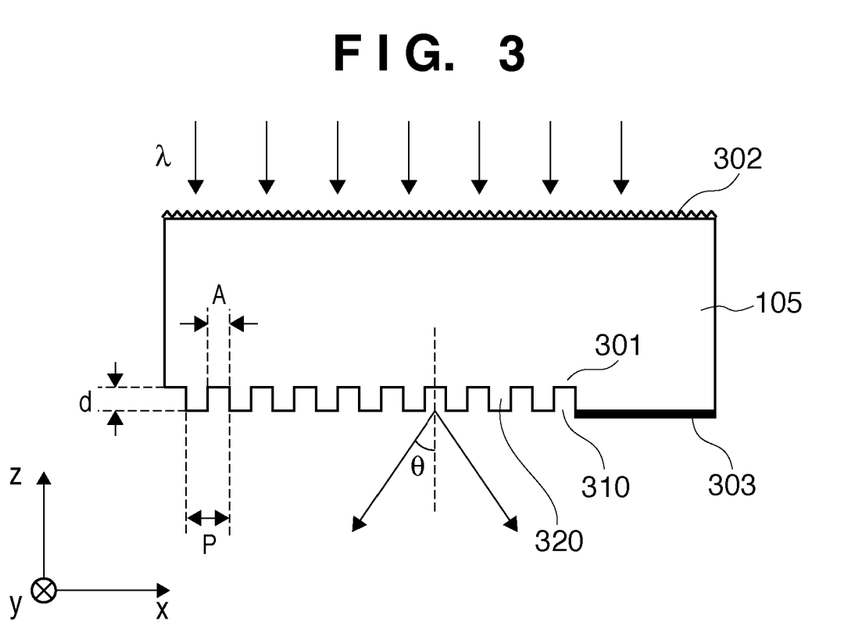
FIG. 3 is a sectional view showing an arrangement example of an original.

FIG. 3 is a sectional view (the x-z plane) showing one arrangement example of the original 105. The original 105 can include a transparent plate made of a material, which is transparent with respect to the wavelength of light emitted by the light source 101, such as quartz. The original 105 has, on the surface of the transparent plate facing the substrate 107, concave portions 310 and convex portions 320 which extend in the y direction and are formed at an equal pitch and cycle in the x direction as a diffraction grating 301.

An antireflection coating 302 is preferably formed on the surface of the transparent plate (the light incident surface of the original 105) opposite to that on which the diffraction grating 301 is formed. Also, a light-shielding film 303 is preferably formed in a region, in which the diffraction grating 301 is not formed, on the surface of the original 105 facing the substrate 107 in order to prevent transmission of any unwanted light.

The diffraction grating 301 is a phase-modulation diffraction grating, and is preferably designed such that an engraving depth d of the concave portion 310 (with respect to the convex portion 320) satisfies:

$$d=\lambda/2[(n-1)] \quad (1)$$

where λ is the wavelength of light emitted by the light source 101, and n is the refractive index of the original 105 with respect to the wavelength λ.

That is, the diffraction grating 301 is preferably designed such that the engraving depth d of the convex portion 320 satisfies a condition in which a 0th-order diffracted light beam transmitted through the convex portion 320 of the diffraction grating 301 is 180° out of phase with that transmitted through the concave portion 310 of the diffraction grating 301. A 0th-order diffracted light beam transmitted through the convex portion 320 and that transmitted through the concave portion 310 interfere with and cancel each other, thus theoretically making it possible to suppress the rate of generation of 0th-order diffracted light beams to zero. To suppress, for example, a decrease in the contrast of the interference pattern upon the generation of 0th-order diffracted light beams due to an error of the engraving depth d, the amount of error of the engraving depth d is preferably suppressed within the range of ±3%.

Letting λ be the wavelength of light (a plurality of light beams), a pitch P of the concave portions 310 or convex portions 320 of the diffraction grating 301 is preferably λ (inclusive) to 3λ (exclusive). In this case, it is possible to suppress the generation of high-order diffracted light beams of the third order or higher.

Letting A be the width of the concave portion 310 of the diffraction grating 301, and P-A be the width of the convex portion 320, the ratio between A and P-A is preferably set to 1:1. That is, designing the diffraction grating 301 such that the ratio of the width A of the concave portion 310 to the pitch P (or the ratio of the width P-A of the convex portion 320 to the pitch P) is 0.5 theoretically makes it possible to suppress the rate of generation of diffracted light beams of even-numbered orders to zero. To suppress, for example, a decrease in the contrast of the interference pattern upon the generation of diffracted light beams of even-numbered orders due to dimensional errors of the concave and convex portions of the diffraction grating 301, that ratio is preferably suppressed within the range of 0.485 (inclusive) to 0.515 (inclusive).

As described above, in this arrangement, the engraving depth of the diffraction grating 301, the pitch of the diffraction grating 301, and the ratio of the width of the concave or convex portion of the diffraction grating 301 to the pitch are adjusted to generate +1st-order diffracted light beams, –1st-order diffracted light beams, and high-order diffracted light beams (of odd-numbered orders). In one example, when the pitch P of the diffraction grating 301 is set to a value smaller than three times the wavelength λ of the light, it is possible to generate only +1st-order diffracted light beams and –1st-order diffracted light beams. In this case, interference fringes are formed by superposing the ±1st-order diffracted light beams on each other on the surface of the substrate 107.

When the light beam perpendicularly enters the original 105, a diffraction angle θ of the ±1st-order diffracted light beams satisfies:

$$\sin \theta = \lambda/P \quad (2)$$

A pitch D of interference fringes formed on the substrate 107 is given by:

$$D=\lambda/2 \sin \theta = P/2 \quad (3)$$

This reveals that a periodic fine pattern according to the light intensity distribution of interference fringes having a pitch half that of the diffraction grating 301 is formed on the substrate 107.

In this example, a periodic fine pattern according to the interference intensity distribution, in which bright and dark portions are periodically repeated in the x direction, is formed in a strip-shaped exposure region (having its longitudinal direction parallel to the x direction) 500 on the substrate 107.

Figure 4:
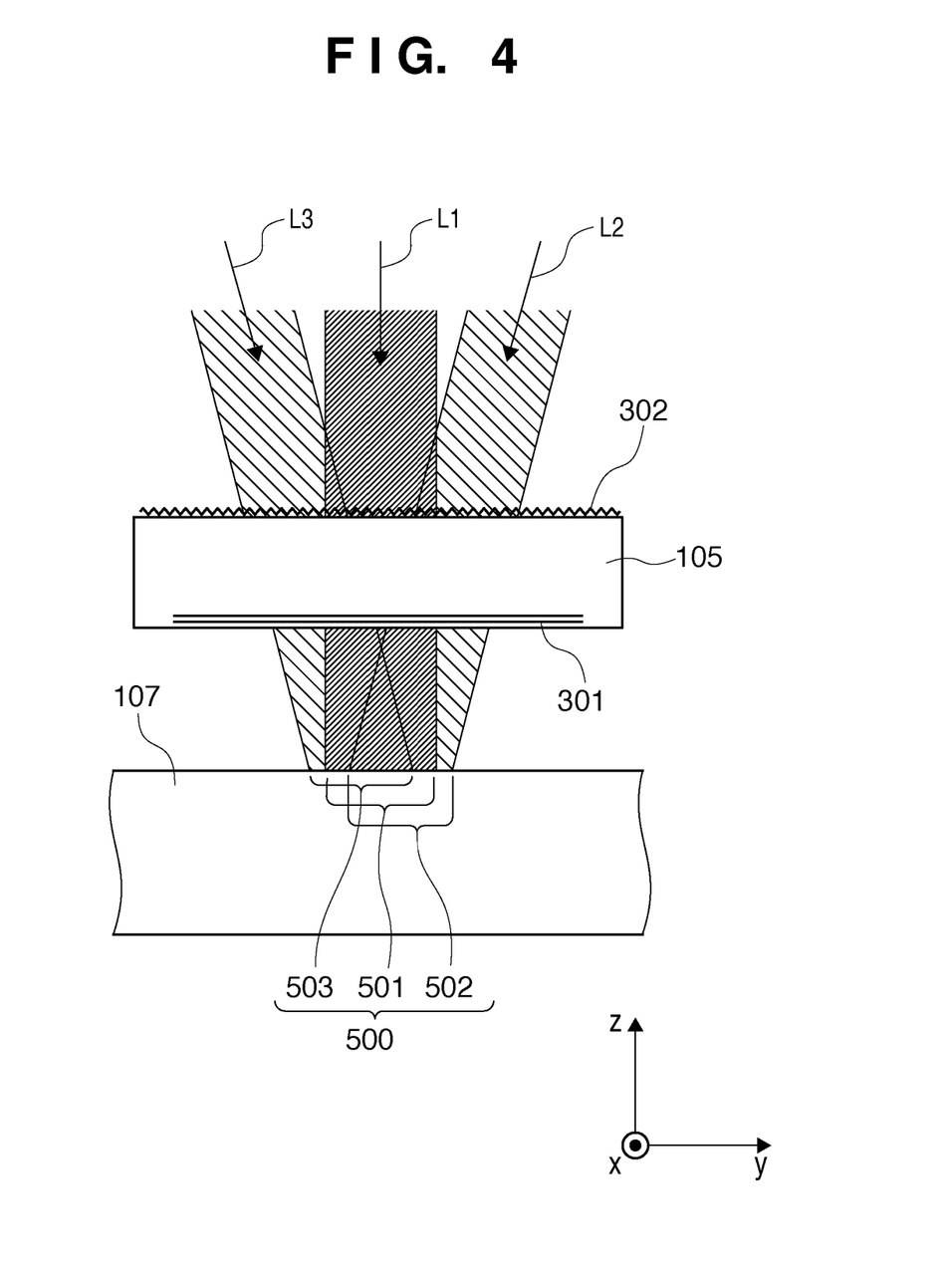
FIG. 4 is a view for explaining a plurality of light beams which enter the original and a plurality of interference patterns formed by them.

FIG. 4 is a view schematically showing the plurality of light beams L1, L2, and L3 which emerge from the light beam dividing optical system 103 and enter the original 105 via the beam shaping optical system 104. Note that the substrate scanning direction is the y direction, and the direction in which the concave portions 310 and convex portions 320 of the diffraction grating 301 extend is also the y direction.

All the light beams L1, L2, and L3 are parallel to the y-z plane. The light beams L1, L2, and L3 enter the original 105 at different incident angles or parallelly to each other. FIG. 4 exemplifies a case in which all the light beams L1, L2, and L3 are parallel to the y-z plane, and they enter the original 105 at different angles. A light beam (diffracted light beam) output from the original 105 as the light beam L1 enters the original 105 forms an interference pattern in a region 501 on the substrate 107. A light beam (diffracted light beam) output from the original 105 as the light beam L2 enters the original 105 forms an interference pattern in a region 502 on the substrate 107. A light beam (diffracted light beam) output from the original 105 as the light beam L3 enters the original 105 forms an interference pattern in a region 503 on the substrate 107. The light beam dividing optical system 103 causes the light beams L1, L2, and L3 to enter the original 105 so that these three different interference patterns partially overlap each other on the surface of the substrate 107, that is, on the image forming plane. Alternatively, the light beam dividing optical system 103 causes the plurality of light beams L1, L2, and L3 to enter the original 105 so that latent images formed on the substrate 107 by these three different interference patterns overlap each other (at a certain time interval) by scanning the substrate 107. More specifically, the directions in which the light beams L1, L2, and L3 emerge from the light beam dividing optical system 103 are determined by taking account of the optical paths of the light beams L1, L2, and L3 in the beam shaping optical system 104, and the overlapping of the interference patterns on the substrate 107.

Figure 5:
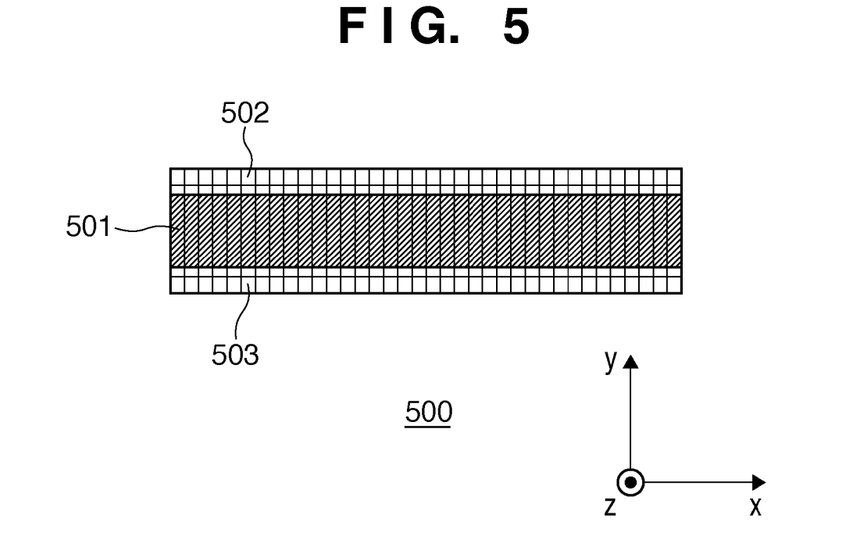
FIG. 5 is a view schematically showing the superposition of the interference patterns.

FIG. 5 is a view schematically showing a region (the exposure region 500 at a certain moment), in which interference patterns are formed, on the substrate 107. The region exposed to the light beam L1 is assumed as 501. Likewise, the regions exposed to the light beams L2 and L3 are assumed as 502 and 503, respectively. As described above, interference patterns are formed in the regions 501, 502, and 503 by the light beams L1, L2, and L3, respectively. In a strip-shaped exposure region (having its longitudinal direction parallel to the x direction) on the substrate 107, an interference pattern is formed by ±1st-order diffracted light beams. Because the light beams L1, L2, and L3 are parallel to the y-z plane, interference patterns formed in the regions 501, 502, and 503 partially overlap each other while being in phase with each other.

The light beams L1, L2, and L3 pass through different optical paths, so the regions 501, 502, and 503 have different speckle noise components. Therefore, the regions 501, 502, and 503 having different speckle noise components are superposed on each other on the substrate while being in phase with each other. With this operation, an interference intensity distribution (a latent image formed to the photoresist applied on the substrate) as a synthesis of a plurality of interference patterns formed on the substrate has an average speckle noise component.

Figure 6:
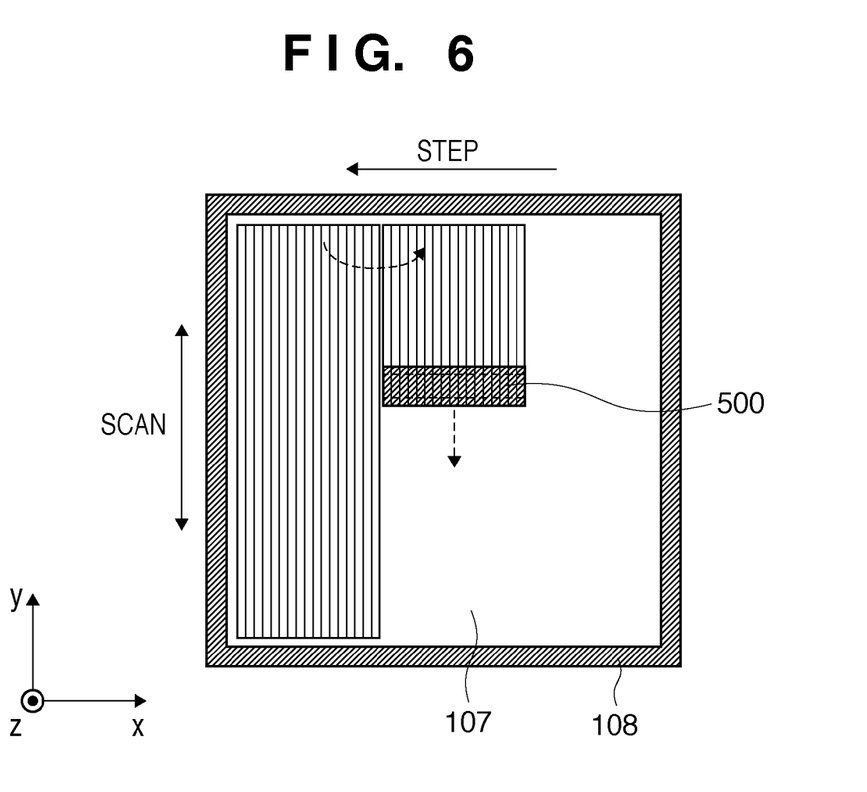
FIG. 6 is a view schematically showing scanning exposure.

FIG. 6 is a view showing the substrate stage 108 which holds the substrate 107 when viewed from the side of the original 105. The substrate 107 is scanned and exposed to light which bears the information of an interference pattern formed in the exposure region 500 by scanning the substrate stage 108 with respect to the original 105. Referring to FIG. 6, an arrow indicated by a solid line points in the driving direction of the substrate stage 108, and that indicated by a broken line points in the direction in which the exposure region 500 moves relative to the substrate 107 upon moving the substrate 107.

If the exposure region 500 is small relative to the substrate 107, the entire surface of the substrate 107 is exposed by alternately repeating an operation for scanning the substrate stage 108 in the y direction and that for moving the substrate stage 108 step by step at a given width in the x direction.

As illustrated in FIG. 6, by scanning and exposing the substrate 107 while scanning the substrate stage 108 with respect to the original 105 in the y direction, an interference intensity distribution formed on the substrate is temporally integrated. With this operation as well, the speckle-induced noise components are averaged.

As described above, according to this embodiment, the exposure apparatus has a simple arrangement and yet comes less under the influence of speckles by spatially, temporally superposing and averaging speckle-induced noise components superposed on an interference intensity distribution formed on a substrate by a diffraction grating.

Second Embodiment

Figure 7:
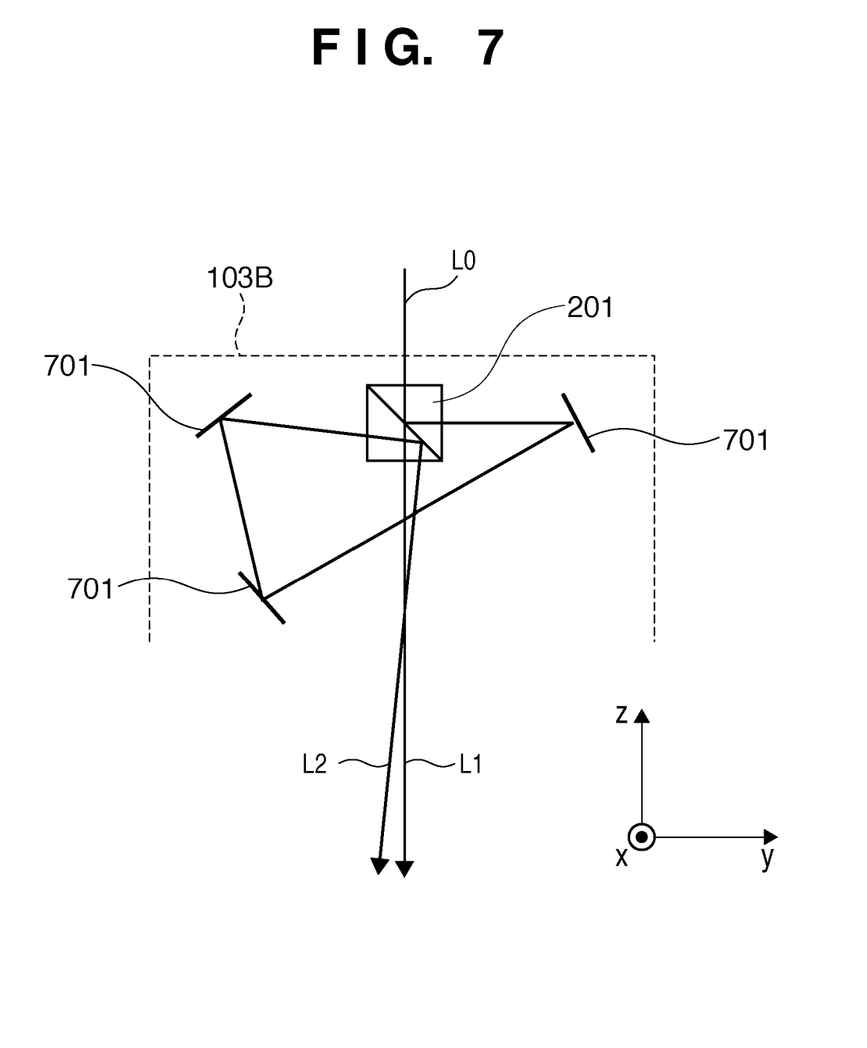
FIG. 7 is a view showing the schematic arrangement of a light beam dividing optical system according to a preferred embodiment of the present invention.

Points of difference from the exposure apparatus according to the first embodiment will be explained. Details which are not particularly referred to herein can be the same as in the first embodiment. FIG. 7 is a view showing the schematic arrangement of a light beam dividing optical system in an exposure apparatus according to the second embodiment of the present invention. In the second embodiment, of the optical paths of a plurality of light beams (in this embodiment, a reflected light beam and a transmitted light beam) split by a beam splitter 201, that of at least one light beam (in this embodiment, the reflected light beam) is extended to give an optical path length difference from other light beams to the at least one light beam. This optical path length difference can be given by, for example, a plurality of reflecting mirrors 701, as illustrated in FIG. 7.

A light beam L0 enters a light beam dividing optical system 103B, shown in FIG. 7, as one example of the light beam dividing optical system 103 mentioned above. The light beam L0 is split into a transmitted light beam L1 and a reflected light beam L2 by the beam splitter 201. The reflected light beam L2 emerges from the light beam dividing optical system 103B after being given an optical path length difference from the transmitted light beam L1 by an optical retardation optical path formed by the plurality of reflecting mirrors 701 inserted in the optical path.

Although optical path length differences given to a plurality of light beams are preferably set equal to or larger than the temporal coherence length of light emitted by a light source 101, they may be set equal to or smaller than the temporal coherence length. By superposing a plurality of light beams having different optical path length differences on each other on a substrate 107, the wave front state changes for each optical path length difference. This makes it possible to reduce the influence of speckle noise generated on a targeted interference pattern.

The difference between the numbers of times of reflection of two light beams by the reflecting surfaces is preferably odd. The reflecting surfaces include herein the reflecting surface of the beam splitter 201. By superposing, on each other on the substrate surface, a transmitted light beam and a reflected light beam reflected by an odd number of reflecting surfaces, the profiles of the light beams are inverted in this superposition even when there is nonuniformity (asymmetry) of the light amount distribution in the plane of the light beam. With this operation, the light amount distribution is uniformed to form a uniform interference pattern on the substrate.

A plurality of reflecting mirrors for giving an optical path length difference to the optical path of a transmitted light beam obtained by splitting a light beam from the light source 101 into a reflected light beam and a transmitted light beam by a reflecting mirror 102 configured as a half mirror may be provided. Even in this case, the difference between the numbers of times of reflection of two light beams is preferably odd.

Third Embodiment

A light beam direction controller which periodically deflects a light beam so that it is scanned within a set range may be provided. Periodically deflecting a light beam which enters an original by the light beam direction controller makes it possible to reduce the influence of speckle noise generated on a targeted interference pattern. This effect can be achieved by providing, for example, a driving mechanism which drives a reflecting mirror which constitutes a light beam dividing optical system 103.

Fourth Embodiment

An optical system which synthesizes a plurality of light beams emitted by a plurality of light sources and guides the synthesized light beam to an original 105 may be provided in place of the light beam dividing optical system 103. Because light beams emitted by the plurality of light beams never interfere with each other, speckles attributed to coherency are reduced. This also has a merit of attaining high-power light emission by multiplying light sources.

Fifth Embodiment

A device manufacturing method according to a preferred embodiment of the present invention is suitable for manufacturing devices such as flat display devices (e.g., an LCD and an SED) and semiconductor devices. The device manufacturing method can include a step of exposing a substrate coated with a photoresist using an exposure apparatus to form a latent image to the photoresist, and a step of developing the photoresist.

A latent image pattern can be typically formed by multiple exposure. A targeted latent image pattern can be formed by compositing a plurality of latent image patterns by multiple exposure.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-102560, filed Apr. 10, 2008, which is hereby incorporated by reference herein in its entirety.

What is claimed is:

1. An exposure apparatus which exposes a substrate coated with a photoresist to form a latent image to the photoresist, the apparatus comprising:
   an original holding unit configured to hold an original including a phase-modulation diffraction grating;
   a substrate holding unit configured to hold the substrate; and
   a light beam splitter configured to split an incident light beam into a reflected light and a transmitted light to form light beams which enter the phase-modulation diffraction grating,
   wherein the light beams which enter the phase-modulation diffraction grating are out of alignment to each other in a direction, the direction being perpendicular to the periodic direction of the phase-modulation diffraction grating in a surface on which the phase-modulation diffraction grating is formed,
   wherein the phase-modulation diffraction grating diffracts each of the light beams from the light beam splitter and generates diffracted light beams from each of the light beams from the light beam splitter, and
   wherein a latent image is formed on the substrate by superposition of interference patterns formed on the surface of the substrate, each of the interference patterns being formed by interfering the diffracted light beams generated from a corresponding one of the light beams from the light beam splitter.

2. The apparatus according to claim 1, wherein
   the substrate holding unit is configured to hold the substrate so that the surface of the substrate is aligned with an image forming plane, and
   the light beam splitter is configured to cause the plurality of light beams to enter the original so that the of interference patterns partially overlap each other on the substrate.

3. The apparatus according to claim 1, wherein the apparatus is configured to expose the substrate while scanning the substrate with respect to the original along a scanning direction, wherein the interference patterns are out of alignment to each other in the scanning direction.

4. The apparatus according to claim 1, wherein the diffraction grating has convex portions and concave portions extending along the direction perpendicular to the periodic direction.

5. The apparatus according to claim 4, wherein
   the original has, on a surface of a transparent plate facing the substrate, the convex portions and the concave portions alternately formed at an equal pitch and cycle as the diffraction grating,
   a depth of the concave portion is $\lambda/[2(n-1)]$ where n is a refractive index of the transparent plate, and $\lambda$ is a wavelength of the plurality of light beams, and
   a variation in the depth of focus between the concave portions falls within a range of ±3%.

6. The apparatus according to claim 5, wherein the pitch is not less than $\lambda$ and is not greater than $3\lambda$.

7. The apparatus according to claim 5, wherein a ratio of a width of one of the convex portion and the concave portion to the pitch is not less than 0.485 and is not greater than 0.515.

8. The apparatus according to claim 5, wherein an antireflection coating is formed on a surface of the transparent plate opposite to the surface of the transparent plate, on which the diffraction grating is formed.

9. The apparatus according to claim 4, wherein travelling directions of the plurality of light beams from the light beam splitter are parallel to a plane containing both of (i) a normal to a surface of the original, on which the convex portions and the concave portions are formed, and (ii) the direction perpendicular to the periodic direction.

10. The apparatus according to claim 9, wherein the travelling directions of the plurality of light beams are not parallel to each other.

11. The apparatus according to claim 1, further comprising an optical system that extends an optical path length difference between the reflected light and the transmitted light split by the light beam splitter.

12. The apparatus according to claim 1, further comprising a shaping optical system which is inserted between the light beam splitter and a plane in which the original is held, and is configured to shape sections of the plurality of light beams emerging from the light beam splitter.

13. The apparatus according to claim 1, wherein the light beams which enter the phase-modulation diffraction grating are arranged in parallel to a plane perpendicular to the periodic direction of the phase-modulation diffraction grating.

14. A method of manufacturing a device, the method comprising:
   exposing a substrate coated with a photoresist using an exposure apparatus to form a latent image to the photoresist; and
   developing the exposed substrate,
   wherein the exposure apparatus comprises:
   an original holding unit configured to hold an original including a phase-modulation diffraction grating;
   a substrate holding the exposure unit configured to hold the substrate; and
   a light beam splitter configured to split an incident light beam into a reflected light and a transmitted light to form light beams which enter the phase-modulation diffraction grating,
   wherein the light beams which enter the phase-modulation diffraction grating are out of alignment to each other in a direction, the direction being perpendicular to the periodic direction of the phase-modulation diffraction grating in a surface on which the phase-modulation diffraction grating is formed,
   wherein the phase-modulation diffraction grating diffracts each of the light beams from the light beam splitter and generates diffracted light beams from each of the light beams from the light beam splitter, and
   wherein a latent image is formed on the substrate by superposition of interference patterns formed on the surface of the substrate, each of the interference patterns being formed by interfering the diffracted light beams generated from a corresponding one of the light beams from the light beam splitter.

* * * * *